United States Patent [19]

Seiden

[11] 4,237,352

[45] Dec. 2, 1980

[54] PATCH MODULE FOR CONNECTING TO OFF-LINE TRANSMISSION LINES OF A SWITCHABLY SELECTED PAIR OF TRANSMISSION LINES

[75] Inventor: Lewis J. Seiden, Tappan, N.Y.

[73] Assignee: T-Bar Incorporated, Wilton, Conn.

[21] Appl. No.: 27,797

[22] Filed: Apr. 6, 1979

[51] Int. Cl.³ .......................................... H01R 19/52
[52] U.S. Cl. .............................. 200/51.03; 200/51.05; 179/95
[58] Field of Search ............... 200/51.03, 51.04, 51.05, 200/51.06, 51.07, 51.09; 179/95, 98, 96; 307/112, 113; 339/18 C, 18 B

[56] References Cited

U.S. PATENT DOCUMENTS

| 3,786,198 | 1/1974 | McNulty et al.179 ....................... 95/ |
| 4,154,994 | 5/1979 | Seiden et al. ........................... 179/96 |

Primary Examiner—Willis Little
Attorney, Agent, or Firm—John C. Dorfman

[57] ABSTRACT

A patch module permitting selective on-line connection between alternative first sets of transmission lines and single second set of transmission lines and permitting access to the off-line first set. The module provides a selector switch for determining which of the first sets is on-line, and a disconnect switch for connecting the selected first set to the single second set. The off-line first set is connected to a wand receptacle for access.

11 Claims, 7 Drawing Figures

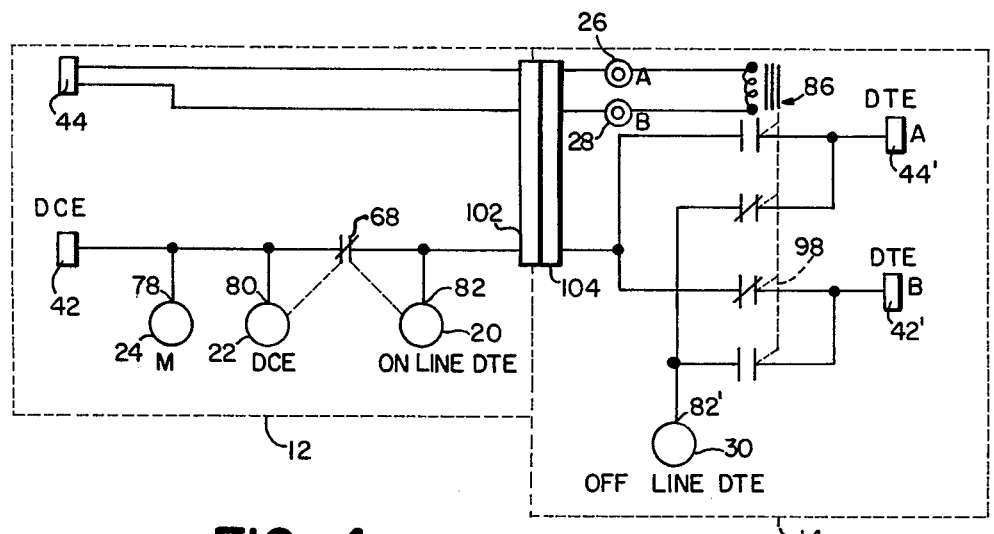
FIG. 4
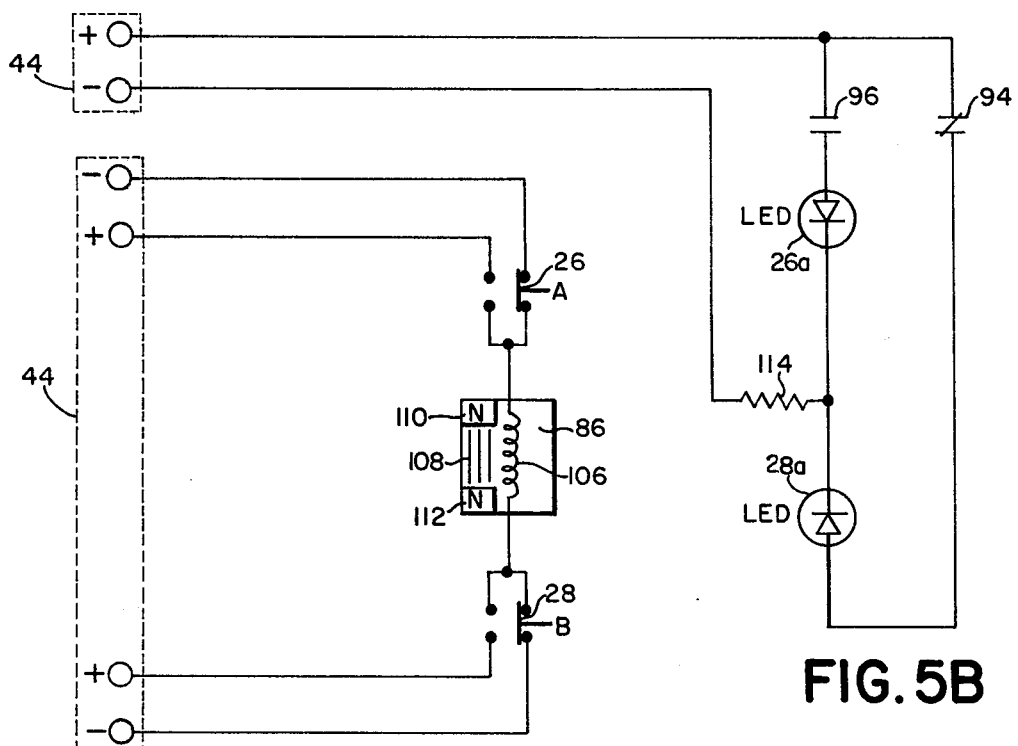
FIG. 5A
FIG. 5B

PATCH MODULE FOR CONNECTING TO OFF-LINE TRANSMISSION LINES OF A SWITCHABLY SELECTED PAIR OF TRANSMISSION LINES

The present invention relates to a patch module involving multiple sets of parallel transmission lines enabling electrical patch connections simultaneously into established circuits of all of the parallel transmission lines in a set with or without interrupting previous circuit connections. The present invention is in a modification and further extension of earlier transmission line patch module inventions of which the present inventor was a co-inventor, specifically, the subject matter of U.S. Pat. Nos. 4,154,904 and 4,158,472, (U.S. applications Ser. No. 810,923, filed June 29, 1977 and Ser. No. 894,104, filed Apr. 6, 1978) which is incorporated herein by reference.

In the use of the multiple parallel transmission lines, particularly for transmission of data, it is frequently desirable to switch a connection of a fixed set of transmission lines to either one of two alternate sets of transmission lines. The present invention permits either an A or a B set of transmission lines to be connected alternatively to still another set of transmission lines. One purpose of the present invention is to enable use of the lines which are off-line (disconnected) whichever that set happens to be at the time. The arrangement permits whichever set is off-line at the time to be connected into another circuit while the on-line set is in primary use. If switching between A and B is done in the course of the use of the sets of lines, the switching may cause an automatic change from the original off-line set through the patching to the new off-line set. The present invention is applied to an off-line unit whether or not it employs the techniques of the prior invention.

Additionally, the present invention improves upon the prior invention by providing additional capability including switching techniques for switching to an alternative set of lines.

In data applications, for example, it is relatively common for a device to have alternative connections to different central processing units to maximize its use. In accordance with the applicant's prior co-inventions, it is possible to monitor the conditions of the lines that are interconnected or, alternatively, to disconnect the on-line set of lines and patch on either side of the disconnect switch to one side of the disconnect switch or the other. If alternative line switching in accordance with the present invention is provided on one side of the disconnect switch, the patching which is accomplished is to one or the other of the alternative devices, depending which is "on-line" as selected by a selection switch. In this description, the selected device and its set of lines is considered "on-line" with the central unit and its set of lines regardless of the state of the disconnect switch. Until the present invention, the non-selected device was then completely eliminated from the system until the selection switch was changed in state.

The present invention enables selection of either an A or a B set of transmission lines for connection to a third set whereby set A may be used on-line part of the time and set B may be used on-line another part of the time. Whichever one of these two sets of lines was down or off-line prior to the present invention, it simply has not been used. The present invention makes it clearly possible to make a patch connection to whichever set, A or B, is off-line and have it automatically switched over to the other set when the alternative connection is made.

More specifically, a patch module in accordance with the present invention permits selective connection between either alternative first sets of transmission lines and a single second set of transmission lines. Input coupling means is provided for each set of transmission lines. At least three sets of stationary patch terminals are provided, one for each of the on-line and off-line sets of the alternative first sets of transmission lines and one for the second set of transmission lines. Each set of patch terminals is positioned relative to a wand receptacle to mate with terminals of a wand. Such mating effects patching to on-line and to off-line transmission lines of the alternative first sets and to the second set of transmission lines. First switch means, for example a disconnect switch, normally interconnects a first and a second set of transmission lines. Second switch means, for example a selection switch, selectively connects one of the alternative first sets on-line to the second set of transmission lines and the other first set of transmission lines to the off-line set of patch terminals. The on-line first set of transmission lines is connected to the on-line patch terminals between the first and second switches and the on-line second set of transmission lines is connected to the patch terminals for the second set.

In accordance with the present invention, a preferred form of plug module is one in which there are three wand receptacles in one column. Use of one receptacle disconnects the on-line sets of lines and connects the wand to the on-line second set of transmission lines. Use of another disconnects the on-line sets of lines and connects the wand to the on-line first set of transmission lines. When the third is used, the on-line sets are not disconnected and a monitoring connection is made to connect the wand to the connected on-line sets of transmission lines. In a second column use of a wand receptacle for the off-line first set of transmission lines connects the set of lines not selected by the second switch means to whatever may be provided at the other end of the wand lead. Preferably, the selection switch means is such that it can identify which set of the alternative A or B first sets of transmission lines is in use so that the other set is identified as the off-line set which is available to be monitored or to be connected by the patch unit.

For a better understanding of the present invention, reference is made to the accompanying drawings in which:

FIG. 4 is a circuit diagram showing a representative circuit schematically showing a single line, but representative of each line of the set of lines in a data transmitting circuit;

FIG. 5A and 5B are circuit diagrams of related circuits showing selection pushbuttons and actuator controls for the alternative line selection switches.

Figure 1:
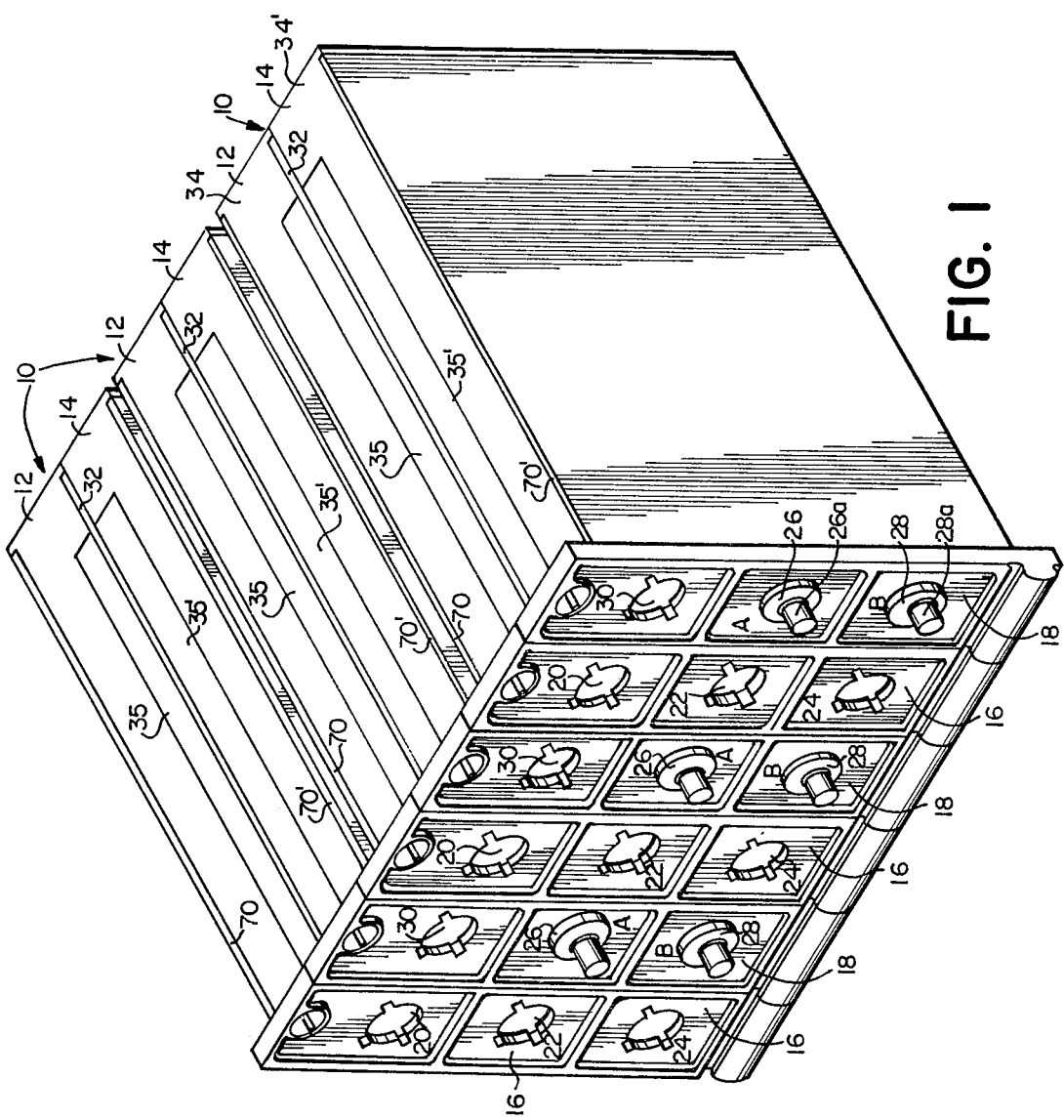
FIG. 1 is a perspective view of an array of patch module units in accordance with the present invention without a wand inserted.

Referring first to FIG. 1, the array of patch module units shown contains three identical patch module units 10. These patch module units are similar in appearance to those shown and described in U.S. Pat. No. 4,154,904, and U.S. Pat. No. 4,158,472, except that the individual units are effectively double the size of the units of these prior applications and advantageously are composed of one such unit 12 slightly modified and a second unit 14 of similar size in external appearance but having a substantially modified interior as will appear from FIG. 3.

As in the earlier structures, the various sets of parallel lines are plugged into sockets (not shown) at the rear of housings 12 and 14 and patch connections or monitoring connections are made through the front access panels 16 and 18, respectively. Access panel 16 is identical to the panels in the previous devices and provides three openings 20, 22 and 24 leading into wand receiving receptacles. In operation, these wand receiving receptacles have precisely the same functions which they did in the prior patch modules.

Within the housing 12 a set of switches connects a set of transmission lines DTE (FIG. 4), preferably connected to a device of one class to a set of transmission lines DCE, preferably connected to a device of a second class. For example, the device of the first class might be data terminal equipment such as a front end processor of a data-processing system. The device of the second class might be data communications equipment such as a modem or multiplexer. Multiple lines providing multiple channels for information, control, and other purposes, are needed in these devices, thus, necessitating simultaneous switching or switch connecting. The normally closed switches which connect the DTE and the DCE lines in accordance with the present invention and the previous disclosure are arranged to be opened from their normally closed position by inserting the wand into either the DTE receptacle 20 or the DCE receptacle 22. A rotation of the fully inserted wand will bring its multiple contacts into operative closed contact condition with multiple fixed contacts corresponding to each of the lines or channels of the DTE lines. Similarly, insertion of the wand into wand receptacle 22 will open the normally closed switches and rotation of the wand will bring its contacts into closed contact condition with fixed contacts connected to DCE lines. Each wand may have a patch lead and a similar wand on the opposite end so that a corresponding number of channels will allow wand patch connections between previously unconnected transmission lines and the devices to which they are attached.

A wand at one end of a patch lead inserted in the DTE wand receptacle 20 of one patch module will connect those DTE lines to selected DCE lines through the wand on the other end of the patch lead inserted into a receptacle corresponding to 22 in a different plug module. The different plug module is connected to a selected set of DCE lines different from those normally connected through the first plug module. Cross-patching of this sort can provide temporary interconnection for emergency, repairs, tests or any other reason.

If, on the other hand, all one wishes to obtain is information about signals or conditions on each of the respective lines, such information can be obtained by inserting a wand having its various leads connected to various selected types of monitor test instrumentation. This is done merely by inserting this wand into the wand receptacle 24, in which case no interruption of the connection between the DTE and DCE lines is accomplished and the normally closed switches between the lines remain closed even though their lines are connected to the monitor.

The present invention is directed to the situation in which alternative A and B DTE lines may be selected for connection to the sole DCE line as in a situation where either of two processing units, A and B, may be selectively connected to a common device. This kind of possibility is encountered with sufficient frequency that the present invention was conceived to serve the need. In accordance with the present invention, second switch means is provided for selecting either the A or the B DTE system of lines. Preferably, this selection is done by pushing an A pushbutton 26 or a B pushbutton 28. In accordance with the present invention, the pushbutton includes illuminated means 26a or 28a, which are illuminated to indicate that one particular pushbutton and the system it represents has been selected by pushing its button. Since there are now two sets of DTE lines, the A set and B set, only the selected "on-line" lines will be patched through the DTE wand receptacle 20. In order to make it possible to monitor the non-selected "off-line" lines, a further wand receptacle 30 is provided through the face of the cover panel 18 along with the pushbuttons 26 and 28.

Figure 6:
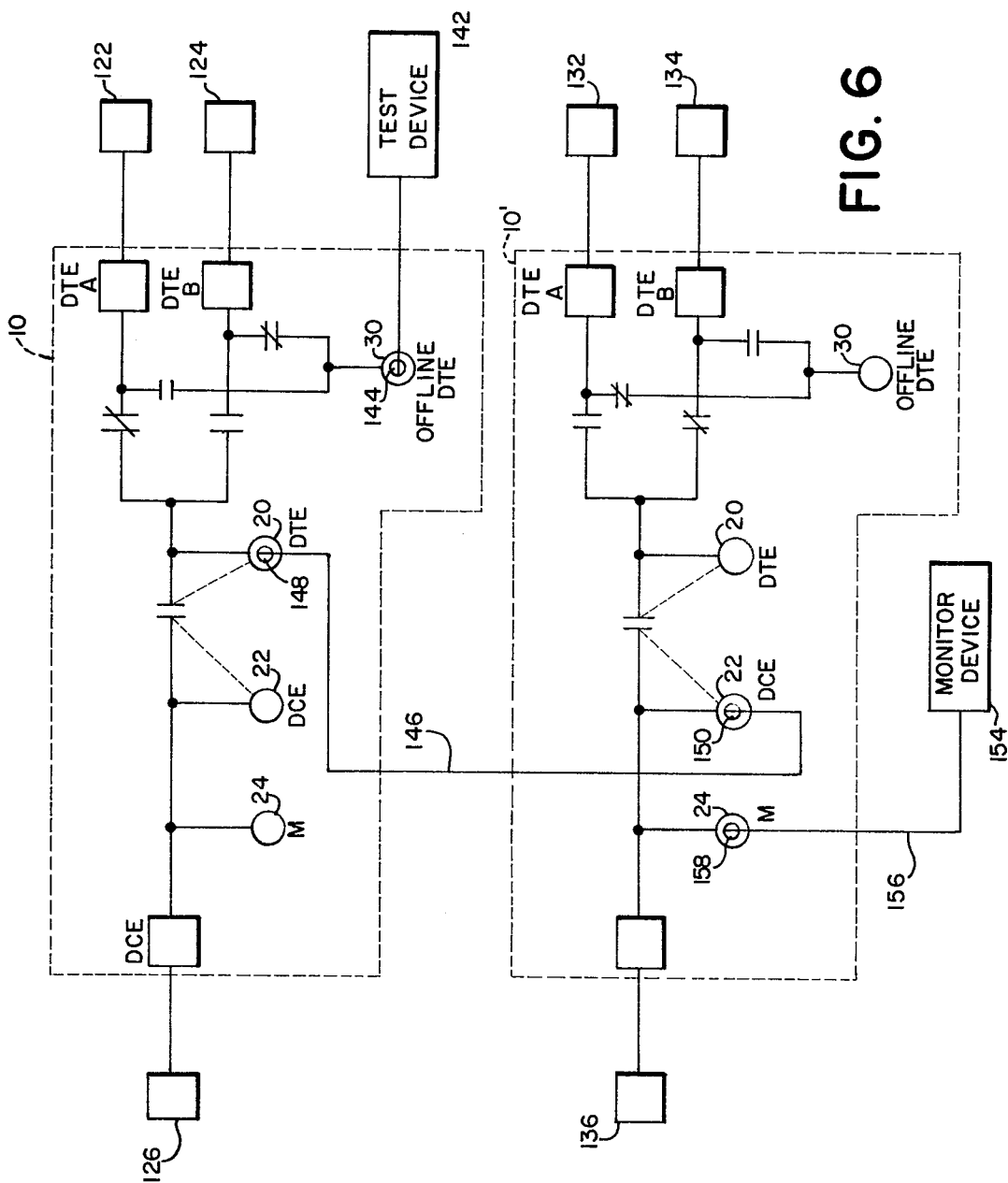
FIG. 6 is a diagram illustrating the use of the patch module unit in connection with duplicate equipment.

FIG. 6 is a diagram illustrating the use of the patch module of the present invention in connection with duplicate equipment. As shown in FIG. 6, the patch module 10 has devices 122 and 124 connected to the A and B connectors and a modem 126 connected to the DCE connector. A second patch module 10' has additional devices 132 and 134 connected to the A and B DTE connectors and another modem 136 connected to the DCE connector. In order to cross patch from the on-line terminal of the module 10 to the other modem of the module 10', a patch line 146 may be connected with a wand 148 in the receptacle 20 of the module 10 and a wand 150 in the receptacle 22 of the module 10'. The insertion of the wands into the receptacles opens the disconnect switches of the modules 10 and 10', as shown. The connection between the on-line unit of the module 10 with the modem 136 of the module 10' may be monitored by a monitor device 154 having a line 156 with a wand 158 inserted in the receptacle 24 of the module 10'. The off-line terminal of the module 10 may be tested by a test device 142 having a test wand 144 inserted in the receptacle 30 of the module 10. As shown in FIG. 6, the device 122 is on-line to the to the modem 136 and the device 124 is off-line. In the module 10', the device 134 is on-line and the device 132 is off-line. When cross patched as shown in FIG. 6, the on-line device 134 is disconnected from the modem 136 but is accessible by the receptacle 20. The device 132, on the other hand, is accessible by the receptacle 30. It will be apparent that the devices 132 or 134 may also be cross patched to the modem 126 at the same time, or to other equipment.

Figure 2:
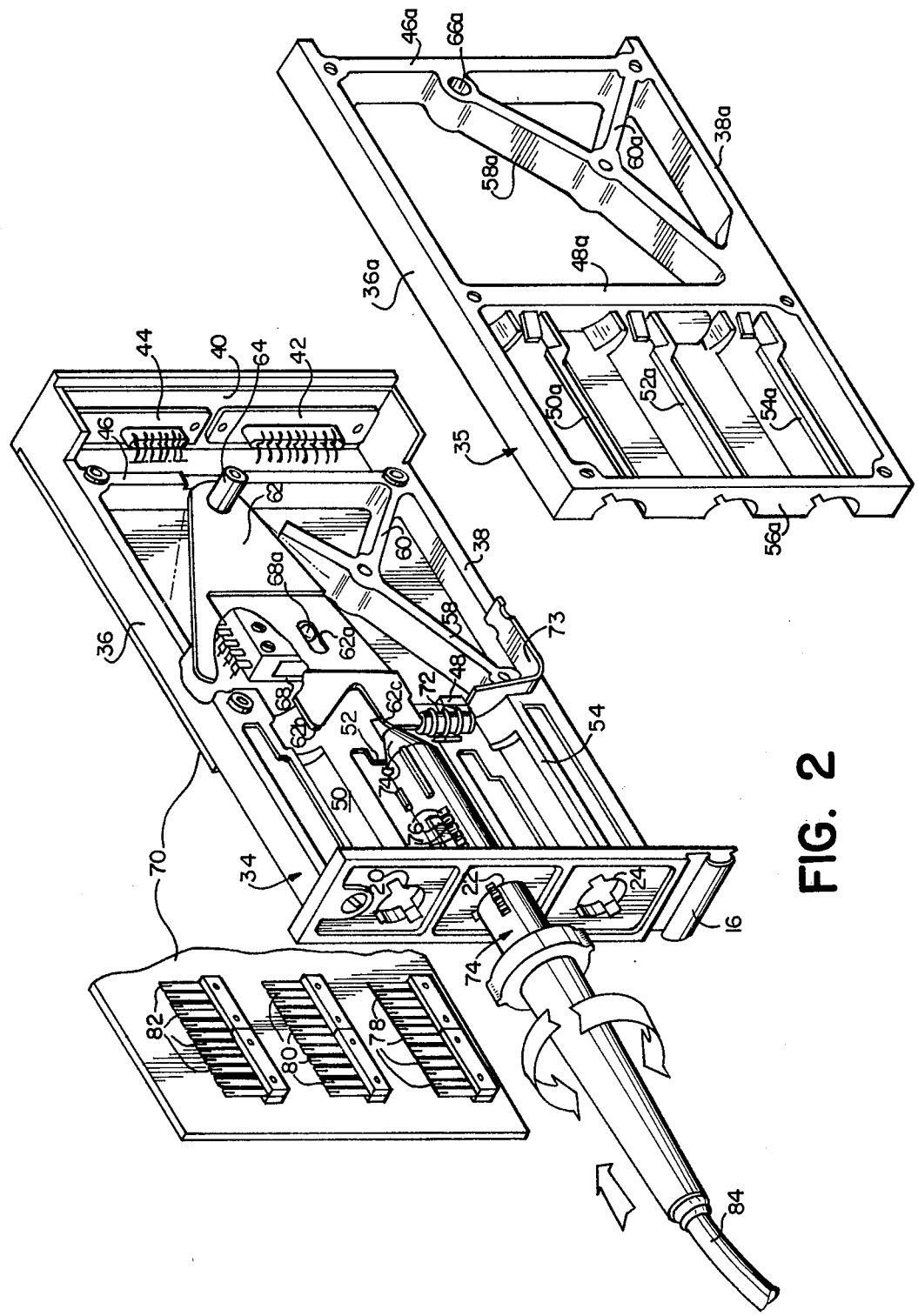
FIG. 2 is an exploded perspective view of half of a patch module unit showing a wand partially inserted into one of the wand receiving receptacles.

Referring now to FIG. 2, the patch module frame unit 12 having three wand receptacles is shown in partial exploded view which shows all of the pieces of this unit structure except for the interior wall printed circuit board 32 whose top edge is seen in FIG. 1. Circuit board 32 is basically a mirror image of board 70. The structure includes a main frame member 34 and an interfitting subframe 35 which are molded in separate pieces in order to make space for the wand receptacles to provide for the reception of the wands, including all the guide structure necessary for proper alignment of the wands within the receptacles.

Frame 34 includes top and bottom of frame walls 36 and 38 which extend the length of the structure and partially close the top and bottom walls. A double end wall structure provides the back wall 40 through which plug connectors 42 and 44 provide entrance of lines in to the plug module units. A second interior structural wall 46 parallel to the back wall has only part of its width. A front wall and cover panel 16 and provides wand access behind openings 20, 22 and 24. Within the frame, behind the panel 16 and between it and medial wall 48 are arranged the portions of the wand receptacles 50, 52 and 54 which support and guide wands to be connected to the DTE lines, to the DCE lines, or to the interconnected DTE/DCE lines (M), respectively. Corresponding frame members are provided on subframe 35, including top and bottom wall members 36a and 38a, back wall 46a and medial wall 48a. Front wall 56a backs up the front panel 16. Likewise, wand receptacle structures 50a, 52a and 54a corresponding to and cooperating with structure 50, 52 and 54 complete the wand guides and supports. It will be apparent that the subframe 35 interfits with the frame 34 and corresponding pieces fit together to extend the structural walls or other elements. Similarly, cross brace 58 and reinforcing strut 60 have counterparts 58a and 60a. These frame structures hold and guide between them lever 62 and support its pin 64, about which lever 62 rotates. Pin 64 is trapped in guide hole 66a in cross brace 58a and a corresponding hole in cross brace 58 (not shown).

The function of the lever 62 is to actuate switch 68 supported on printed circuit board 70 and a similar switch (not shown) on printed circuit board 32, which have multiple contacts to provide the normally closed disconnect switches interconnecting the DTE and DCE lines. All of the contacts are actuated out of their normally closed position into a normally open position by movement of the lever through pushbutton actuator 68a which cooperates with slot 62a in lever 62. The lever is moved by contact with the nose 74a of a wand 74 by engaging one of the cam surfaces 62b or 62c to urge the lever downwardly against the action of spring 72, as seen in FIG. 2.

As discussed in the previous applications, and as fully disclosed therein in greater detail, the detail of which is incorporated herein by reference, the wand receptacles are provided with guides which prevent the wand from being misdirected and inadvertently striking its switch contacts 76 against stationary contacts 78, 80 or 82. When the wand is fully inserted, the structure permits rotation, as described in the previous applications, whereby the wand contacts mate with contact individual stationary contacts corresponding to contacts 78, 80 or 82 on the printed circuit boards 32 and 70 located on either side of the wand receptacle. In the present case, the contacts 82 are connected to the DTE lines 78, contacts 80 are connected to the DCE lines, and contacts 78 are connected to the DCE lines. In this latter case, the wand provides no contact with the lever 62 so that the switch connection through switches 68 is never interrupted but a leaf spring 73 may be provided to aid in the withdrawal of the wand and to assure positive engagement of the wand in the receptacle. Contacts made by terminals 76 are transmitted through cable lead 84 providing as many wires (e.g., 24 wire) as there are terminals and, depending upon whether it is a monitoring lead or patching lead, are connected to instrumentation or to a similar wand structure, respectively, at the opposite end of the cable lead 84.

Figure 3:
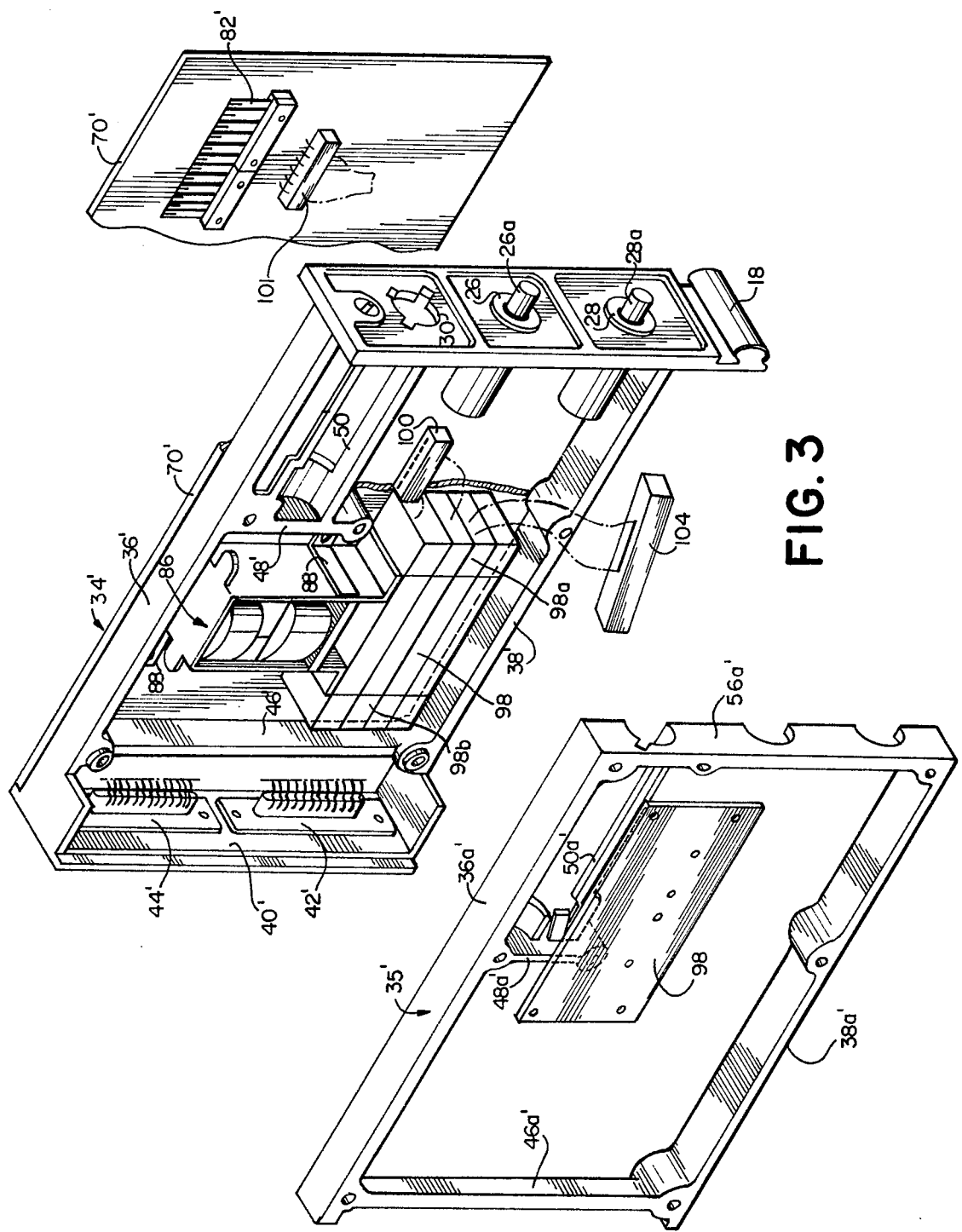
FIG. 3 is a perspective exploded view of the other half of the patch module unit.

Referring now to FIG. 3, the other frame unit 14 of the housing 10 is shown in an exploded view. Many of the parts shown are similar and are identified by similar numbers with addition of primes thereto. Thus, there is a main frame 34' and an interfitting subframe 35' of mirror image orientation as best viewed in FIG. 1. These frames have top wall 36' and 36' and bottom walls 38' and 38a'. The frame 34' has a backwall 40' through which extend connectors 42' and 44'. Connector 44' brings in the DTE A lines and connector 42' brings in the DTE B lines. There is a main compartment back wall 46' and 46a' and a front wall 56, 56a' to which in this case is fixed the front cover panel 18. There is a partial dividing wall 48', 48a', but it does not extend to the bottom wall 38', 38a'. Wall 48', 48a' closes the end of wand receptacle structure 50', 50a' behind wand receptacle opening 30. Printed circuit board 70' is much the same as printed circuit board 70 in that it serves as an outer wall closure as well as providing a mounting for the off-line DTE receptacle contacts 82'. However it requires only a single set of stationary contacts 82' in view of the single wand receptacle and there are other circuit differences which are not material here.

The interior of the frame structure is entirely different and consists of a electromagnetic actuator 86, the frame of which is fastened to the printed circuit board 70' by brackets 88. Also connected to the frame to be actuated by the core are a series of switch wafers, designated 98, preferably made in accordance with the teaching of the U.S. Pat. No. 3,226,508 of Henry A. Morgan et al whereby, for example, 12 switches can be switched from one position to another simultaneously within each switch wafer. In this case since four wafers are stacked together there are 48 switches that are actuated simulataneously. The switch wafers are advantageously fashioned in accordance with the aforesaid patent so that connectors may be plugged onto the terminals at each end of the switch wafer packages through connectors 98a and 98b. In order to avoid confusion, actual electrical connections have been omitted and only the physical connector structures are shown, but it will be understood by those skilled in the art that the mechanical switch packages are interconnected as will be explained hereafter in connection with the circuit diagrams.

Completing the structure associated with the wand receptacle 50', 50a' is a similar set of stationary switch contacts corresponding to contacts 82' on printed circuit board 70' but positioned on small printed circuit board panel 98 to mate with the terminals on the opposite side of the wand from those which mate with contacts 82'. Because the printed circuit board does not extend back to the entry connectors 42' and 44', or connectors 42 and 44 on the other frame unit of the module, other connectors and wiring must be supplied similar to the connections between plugs 98a and 98b and connectors 100 and 101, some of which wiring has been indicated, for example, by broken lines in FIG. 3. Similarly, since the two frame units 12 and 14 must be connected together, an output connector 102 is provided in the unit 12 through the intermediate printed circuit board 32 to which a plug 104 can be connected to connect the two units together electrically. Other connections will be explained and will become clear from the discussion of the circuit diagrams which follows.

Referring now to FIG. 4, the drawing shows a circuit as a single line whereas in reality each line shown may be conceived to be 23 separate lines, or even 24, if a ground line is considered. The 23 lines are parallel with one another, each is connected to a separate terminal of a connector element or a separate terminal of a switch element. The dashed lines represent schematically and very roughly the housing frame units 12 and 14. In the predecessor device represented primarily by frame unit 12 both a DCE input, which in this application is represented by connector 42, and a DTE input, for example, represented by connector 44', would be kept in the same housing. In the present case, there are two DTE connectors, A connector 44' and B connector 42'. These are placed in the frame unit 14. The DCE lines are connected to the DTE line through switches 68 which are normally closed. The four switch wafers 98 representing 23 switche pairs for 23 lines, are connected as shown to make possible off-line patching of the 23 lines of the 24 lines. The 24th line is a common line. All of the 23 switche pairs have at least one terminal of each switch pair connected to one of the input connectors 42' and 44', the connector 104, and the stationary terminals 82' of the off-line DTE wand receptacle 30. Connections through connectors 104 to connector 102 extend the on-line DTE lines from housing frame unit 14 to housing frame unit 12 and their connection to switch 68. The off-line DTE lines are extended to the terminal 78'. In unit 12, the connections from connector 102 continue the circuit through the respective printed circuit boards to the fixed terminals 82 of the on-line DTE receptacle 20 and switch 68. The other side of switch 68 continues the circuit to the fixed terminals 78 and 80 of the wand receptacles 22 and 24, respectively, and the connector 42. Power is supplied to the electromagnetic actuator 86 through the respective pushbuttons 26 and 28 by virtue of the control connector 44 and the 102–104 motor-unit connection that extends across the housing. This circuit will be better understood by reference to FIGS. 5A and 5B, described hereinafter.

The operation of FIGS. 4 and 5 is simply one in which the actuator position determines which contacts in switch 98 will be closed and which open. When connecting DTE A line to the DCE line, the switch 98 is actuated away from its normal position. This connects 44' to connector 104 and 42' to terminals 82'. Simultaneously, contact 96 of FIG. 5B is closed and contact 94 is open. This illuminates indicator 26a, indicating that the A set has been selected. Thus, at this time, wand receptacle 20 provides "on-line" patching of DTE A lines, while receptacle 30 provides "off-line" monitoring of DTE B lines. When the actuator changes switch positions os that DTE B is on-line and DTE A goes off-line, by reverting to the normal position, contact 94 is closed and contact 96 opens.

Referring now to FIG. 5A in this particular emobodiment the winding 106 of switch actuator 86 is shown in a circuit containing switch 26, the means of selecting the first DTE transmission lines A as on the on-line set. Similarly, switch 28 selects DTE B transmission lines as the on-line set. The switches are positioned so that the switches 26 and 28 select the opposite polarity for the winding 106. Each of the switches has two positions. The normally closed position shown connects lines of the same polarity (here negative) to both ends of the winding 106 so that no current flows. The switches are spring biased into the positions shown but may be pushed into the alternative position in which another set of contacts connects the positive potential to its end of the winding. Closing the positive contacts of switch 26 will impose a positive potential at the top, and a negative potential at the bottom, of winding 106 giving a magnetic polarity in one direction. On the other hand, closing the normally open contacts of switch 28 while keeping the normally closed contacts of switch 26 closed will cause a current flow in the opposite direction. It will be observed that the opposite directions of current flow will induce opposite magnetic polarities in the actuator core 108. Associated magnetic pole pieces 110 and 112 are provided with the same polarity so that as polarity of the core 108 is reversed, the end of the core which has corresponding polarity with the pole pieces will be repelled and that having opposite polarity will be attracted, thus, causing the core to move from one position to the other. Even when the current is removed from the winding 106, the core 108 will be latched magnetically in the position into which it has moved due to the presence of the permanent magnet. Thus, the switches 98 connected to the core will maintain the same condition until the solenoid is again activated in the opposite direction by pushing the appropriate botton to select the other set of first transmission lines as the on-line set, i.e., if set A has been the on-line set, then pushing button 28 will change the polarity so that set B becomes the on-line set.

In order to provide identification for the selected A or B set, as described above, the circuit of FIG. 5B may be provided wherein the contact 96 is connected in series with the light emitting diode 26a providing illumination of pushbutton 26 to indicate that the A set has been selected. Similarly, the contact 94 is provided in series with the light emitting diode 28a, indicating when illuminated that set B has been selected. The contacts 94 and 96 utilize the position of the line in the switch package 98. The photodiodes are connected in parallel circuits with the parallel circuits connected in series with a dropping resistor 114 to apply the proper voltage across the photodiodes. The power supplied to the control connector 44 may be externally controlled to make the desired selection between A set and B set of transmission lines.

The present invention has been described in terms of a particular embodiment. The description will suggest certain modifications or alternatives within itself. Other alternatives or modifications or variations will be apparent to those skilled in the art. All such modification, variations and changes within the scope of the appended claims are intended to be within the scope and spirit of the present invention.

I claim:

1. A patch module permitting selective on-line connection between either alternative first sets of transmission lines and a single second set of transmission lines and providing patch connection into an off-line first set, comprising:
   a housing providing a support frame for the module components;
   input coupling means into the module housing for each of the three sets of transmission lines;
   a set of stationary off-line patch terminals supported by the housing; and
   selector switch means selectively connecting one of the alternative first sets of transmission lines on-line to the single second set of transmission lines and the other first set to the off-line patch terminals in one condition and in the alternate switch condition connecting the other first set on-line to the second set of transmission lines and the one to the off-line patch terminals.

2. The patch module of claim 1 having a wand receptacle, said set of patch terminals having its terminals positioned relative to said wand receptacle to mate with terminals of a wand patch element to facilitate patching.

3. The patch module of claim 2 including a wand patch element having a number of patch lines and associated wand terminals corresponding to the number of transmission lines in said sets, said terminals operable to mate with the patch terminals for making a patch connection to the off-line first transmission line patch terminals.

4. A patch module permitting selective on-line connection between either alternative first sets of transmission lines and a single second set of transmission lines, comprising:
   a housing providing a support frame for the module components;
   input coupling means into the module housing for each of the three sets of transmission lines;
   three separate sets of stationary patch terminals, including one each for the off-line and on-line alternative first sets of transmission lines and one for the second transmission lines;
   first switch means normally interconnecting a first and the second set of transmission lines; and
   second switch means selectively connecting one of the alternative first sets on-line to the first switch means and the off-line first set of transmission lines to the off-line patch terminals in one condition and in alternative switch condition connecting the other first set on-line to the first switch means and the one to the off-line patch terminals.

5. The patch module of claim 4 in which each set of patch terminals has its terminals positioned relative to a wand receptacle to mate with terminals of a wand patch element to facilitate patching.

6. The patch module of claim 5 in which a wand patch element having a number of wand patch terminals corresponding to the number of transmission lines, which mate with the stationary patch terminals supported on the housing, is provided for making a patch connection to any one of said three separate sets of stationary patch terminals.

7. The patch module of claim 6 in which the wand patch element has a patch lead having lines corresponding in number to transmission lines in said sets, said lead being terminated by a similar wand patch element to enable transmission lines from one patch module to be connected to transmission lines of another module.

8. A patch module permitting selective on-line connection between either of alternative first sets of transmission lines and a second set of transmission lines comprising:
   a housing providing a support frame for module components;
   input coupling connections into the module housing for each set of transmission lines,
   three separate sets of stationary patch terminals, including one each for the off-line and on-line alternative first sets of transmission lines and one for the second set of transmission lines;
   first switch means normally interconnecting on-line, a first and second set of transmission lines;
   second switch means selectively connecting one of the alternative first sets on-line to the first switch means and the other first set of transmission lines to the off-line patch terminals in one condition and in alternative switch condition connecting the other first set on-line to the first switch means and the one to the off-line path terminals;
   at least three patch wand receptacles with access openings provided in the housing to the respective patch terminals, one for each of the two on-line sets of transmission lines and one for the off-line set of transmission lines;
   means enabling the first switch means to be interrupted by insertion of a wand making a patching connection to either of the two on-line sets of transmission lines; and
   switch control means for the second switch means permitting manual selection of one of the alternative first sets of transmission lines for connection to the second set of transmission lines, said control means being positioned on the housing in relation to the access openings for the wand receptacle.

9. The patch module of claim 8 in which a fourth wand receptacle is provided with an access opening in the same housing face as the others and in which patch terminals connected to the second transmission lines are positioned relative to the fourth wand receptacle in position to mate with the same wand used in other receptacles of the module but with no means enabling interruption of the first switch means.

10. The patch module of claim 9 in which the access openings for the wand receptacles for patching into the on-line sets transmission lines respectively are in a column together, and the receptacle for patching into the off-line first set of transmission lines is in a second column together with selector switch control means for the second switch means for selecting between the alternative first transmission lines.

11. The patch module of claim 10 in which the selector switch control means are illuminated pushbuttons whereby the pushbutton for selecting whichever of the alternative first sets of lines will be on-line will become illuminated when said set of transmission lines is selected.

* * * * *

UNITED STATES PATENT AND TRADEMARK OFFICE
CERTIFICATE OF CORRECTION

PATENT NO. : 4,237,352
DATED : December 2, 1980
INVENTOR(S) : Lewis J. Seiden

It is certified that error appears in the above-identified patent and that said Letters Patent are hereby corrected as shown below:

Column 6, line 7, "36'" (second occurrence) should be --36a'--.

Column 7, line 51, "os" should be --so--.

Column 8, line 22, "botton" should be --button--.

Signed and Sealed this

Seventh Day of April 1981

[SEAL]

Attest:

RENE D. TEGTMEYER

Attesting Officer    Acting Commissioner of Patents and Trademarks

UNITED STATES PATENT AND TRADEMARK OFFICE
CERTIFICATE OF CORRECTION

PATENT NO. : 4,237,352

DATED : December 2, 1980

INVENTOR(S) : Lewis J. Seiden et al.

It is certified that error appears in the above-identified patent and that said Letters Patent is hereby corrected as shown below:

Column 1, line 16, "4,154,904" should be --4,154,994--.

Column 3, line 3, "4,154,904" should be --4,154,994--.

Signed and Sealed this

Seventh Day of October, 1986

[SEAL]

*Attest:*

DONALD J. QUIGG

*Attesting Officer*     *Commissioner of Patents and Trademarks*